United States Patent
Muto et al.

(10) Patent No.: US 11,030,139 B2
(45) Date of Patent: Jun. 8, 2021

(54) CIRCUIT DEVICE, CIRCUIT DEVICE DETERMINATION METHOD, AND ELECTRONIC APPARATUS

(71) Applicant: SEIKO EPSON CORPORATION, Tokyo (JP)

(72) Inventors: Kota Muto, Matsumoto (JP); Toshimichi Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/828,022

(22) Filed: Mar. 24, 2020

(65) Prior Publication Data
US 2020/0311007 A1    Oct. 1, 2020

(30) Foreign Application Priority Data
Mar. 25, 2019  (JP) .............................. JP2019-055925

(51) Int. Cl.
*G06F 13/40*  (2006.01)
*H03K 19/0175*  (2006.01)
*G06F 13/42*  (2006.01)
*G06F 13/38*  (2006.01)

(52) U.S. Cl.
CPC ...... *G06F 13/4081* (2013.01); *G06F 13/4282* (2013.01); *H03K 19/0175* (2013.01); *G06F 13/387* (2013.01); *G06F 2213/0042* (2013.01)

(58) Field of Classification Search
CPC .... G06F 13/38; G06F 13/387; G06F 13/4045; G06F 13/4081; G06F 13/4086; G06F 13/4265; G06F 13/4282; H03K 19/0175; H03K 19/017545
See application file for complete search history.

(56) References Cited

U.S. PATENT DOCUMENTS

| | | | |
|---|---|---|---|
| 2001/0017846 A1* | 8/2001 | Wu ...................... | G06F 13/4086 370/257 |
| 2008/0059661 A1 | 3/2008 | Akahane | |
| 2011/0148470 A1 | 6/2011 | Inoue | |
| 2013/0191566 A1* | 7/2013 | Kaestner ............... | G06F 13/426 710/104 |
| 2014/0075070 A1* | 3/2014 | Fu ....................... | G06F 13/4295 710/106 |

(Continued)

FOREIGN PATENT DOCUMENTS

| | | |
|---|---|---|
| JP | 2008-059409 A | 3/2008 |
| JP | 2011-061629 A | 3/2011 |
| JP | 2011-129042 A | 6/2011 |

OTHER PUBLICATIONS

"Universal Serial Bus Specification". Revision 2.0. Apr. 27, 2000. Compaq Computer Corporation et al. Sectionn 7.1.7.3. pp. 149-152. (Year: 2000).*

*Primary Examiner* — Thomas J. Cleary
(74) *Attorney, Agent, or Firm* — Oliff PLC (57) ABSTRACT

A circuit device includes a control circuit configured to instruct, when a detection circuit detects that an amplitude level of a packet exceeds a disconnecting detection level, a packet output circuit to lower an amplitude level of a part or all of packets, and after the instruction, to determine that, when the detection circuit detects that an amplitude level of a packet again exceeds the disconnecting detection level, a USB device connected to a bus is disconnected.

6 Claims, 7 Drawing Sheets

(56) References Cited

U.S. PATENT DOCUMENTS

| | | | |
|---|---|---|---|
| 2014/0149609 A1* | 5/2014 | Chan | G06F 13/385 |
| | | | 710/16 |
| 2015/0074323 A1* | 3/2015 | Chumbalkar | G06F 13/40 |
| | | | 710/316 |
| 2016/0004661 A1* | 1/2016 | Dixit | G06F 1/266 |
| | | | 710/106 |
| 2016/0267044 A1* | 9/2016 | Wu | G06F 13/4282 |
| 2018/0212796 A1* | 7/2018 | Kamihara | G06F 11/00 |
| 2019/0004590 A1* | 1/2019 | Srivastava | G06F 1/3253 |
| 2019/0303330 A1* | 10/2019 | Kagaya | G06F 13/4022 |
| 2020/0250122 A1* | 8/2020 | Kagaya | G06F 13/4282 |
| 2020/0334188 A1* | 10/2020 | Muto | G06F 13/385 |

* cited by examiner

CIRCUIT DEVICE, CIRCUIT DEVICE DETERMINATION METHOD, AND ELECTRONIC APPARATUS

The present application is based on, and claims priority from JP Application Serial Number 2019-055925, filed Mar. 25, 2019, the disclosure of which is hereby incorporated by reference herein in its entirety.

BACKGROUND

1. Technical Field

The present disclosure relates to a circuit device, a circuit device determination method, and an electronic apparatus, for example.

2. Related Art

When a signal is transmitted and received based on a universal serial bus (USB) standard, a countermeasure such as increasing an amplitude level of the signal in advance on a transmission side in consideration of attenuation and the like may be adopted. However, when the amplitude level exceeds a disconnecting detection level, it is determined that a counterpart device for communication is disconnected even though the counterpart device is connected.

Therefore, a technique for increasing the disconnecting detection level when the amplitude level is increased is proposed (see, for example, JP-A-2011-129042).

However, the above-described technique requires a separate configuration for changing the disconnecting detection level, specifically, a configuration for generating a plurality of reference voltages and selecting any one of the reference voltages. Therefore, there is a problem that the configuration is likely to be complicated.

SUMMARY

A circuit device according to an aspect includes a packet output circuit configured to transmit packets to a bus according to a USB standard in a manner capable of changing an amplitude level of the packet; a detection circuit configured to detect whether an amplitude level of a packet transmitted to the bus exceeds a disconnecting detection level; and a control circuit configured to instruct, when the detection circuit detects that the amplitude level of the packet exceeds the disconnecting detection level, the packet output circuit to lower an amplitude level of a part or all of packets, and after the instruction, to determine that, when the detection circuit detects that an amplitude level of a packet again exceeds the disconnecting detection level, a USB Device connected to the bus is disconnected.

DESCRIPTION OF EXEMPLARY EMBODIMENTS

Hereinafter, a circuit device according to an embodiment will be described with reference to the drawings. In respective drawings, a size and a scale of respective parts are appropriately changed from actual ones. In addition, since the embodiment described below is a preferable specific example, various technically preferable limitations are attached thereto. However, the scope of the present disclosure is not limited to the embodiment unless otherwise specified in the following description.

Figure 1:
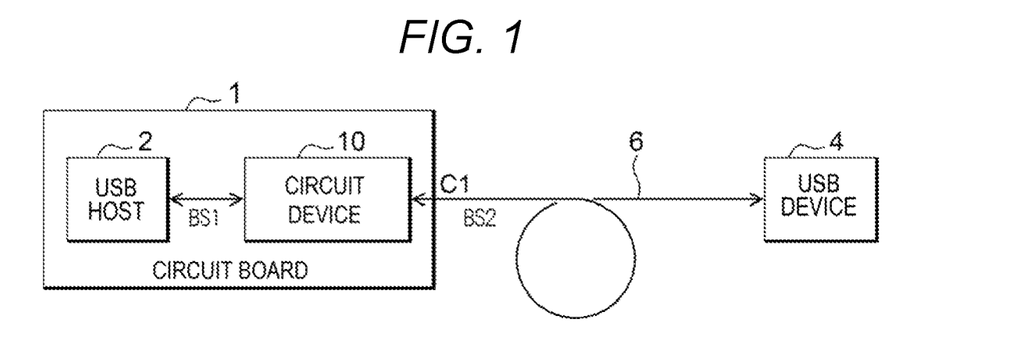
FIG. 1 is a diagram showing connecting between a circuit device according to an embodiment and other devices.

FIG. 1 is a diagram showing connecting of a circuit device 10 and the like according to the embodiment. As shown in the drawing, one end of the circuit device 10 is connected to a USB Host 2 via a bus BS1, and the other end of the circuit device 10 is connected to a USB Device 4 via a bus BS2. Specifically, the USB Device 4 is a device, such as a memory card, a Bluetooth (registered trademark) device, or a dedicated short range communications (DSRC), controlled by the USB Host 2. The buses BS1 and BS2 are USB standard buses including signal lines of differential transmission signals DP and DM The bus BS2 is an example of a bus, and the bus BS1 is an example of another bus.

When the USB Host 2 is an in-vehicle device such as a car navigation device, for example, a connect or C1 connected to the other end of the circuit device 10 is provided on a console or the like in a vehicle, and the USB Device 4 is connected to the connect or C1 via a USB cable 6.

When the USB cable 6 is relatively short, it is possible to connect the USB Host 2 to the USB Device 4 without using the circuit device 10. However, when the USB cable 6 is relatively long, a signal output from the USB Host 2 is attenuated by the USB cable 6 with a waveform thereof being blunted, and reaches the USB Device 4. Therefore, the circuit device 10 provided between the USB Host 2 and the USB Device 4 is configured to re-synchronize and amplify the signal output from the USB Host 2 so as to compensate attenuation at the USB cable 6 in advance, and then output the signal.

Specifically, the USB Host 2 and the circuit device 10 are mounted on a circuit board 1, the circuit device 10 is connected to the connect or C1, and the USB Device 4 is further connected to the connect or C1 via the USB cable 6.

Figure 2:
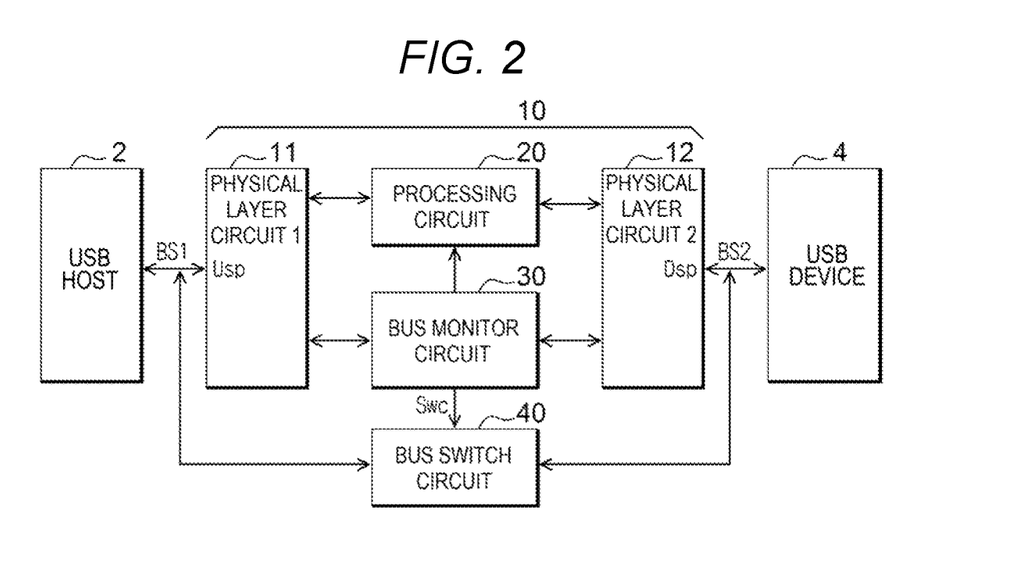
FIG. 2 is a diagram showing connecting between a main part configuration in the circuit device and other devices.

FIG. 2 is a block diagram showing a schematic configuration of the circuit device 10. In FIG. 2, the circuit device 10 includes physical layer circuits 11 and 12, a processing circuit 20, a bus monitor circuit 30, and a bus switch circuit 40.

In FIG. 2, '1_ is assigned to the physical layer circuit 11 to distinguish the physical layer circuit 11 from the physical layer circuit 12. Similarly, '2_ is assigned to the physical layer circuit 12 to distinguish the physical layer circuit 12 from the physical layer circuit 11.

The bus BS1 is connected to the physical layer circuit 11, and the bus BS2 is connected to the physical layer circuit 12. The physical layer circuits 11 and 12 are formed of physical layer analog circuits. Examples of the physical layer analog circuit include a transmission circuit, a reception circuit, various detection circuits, and a pull-down resistor.

The bus monitor circuit 30 monitors the bus BS1 and the bus BS2 separately, and outputs a signal Swc to the bus switch circuit 40 based on monitored results.

The bus switch circuit 40 is turned on or off between the bus BS1 and the bus BS2 in accordance with the signal Swc. Specifically, the bus switch circuit 40 is turned on when the signal Swc is at an H level, and is turned off when the signal Swc is at an L level.

The bus monitor circuit 30 determines an operation mode based on the monitored results of the bus BS1 and the bus BS2. The operation mode includes a high speed (HS) mode and a full speed (FS) mode according to the USB standard, and the bus monitor circuit 30 controls respective units in a determined operation mode. The bus monitor circuit 30 is an example of a control circuit.

Figure 4:
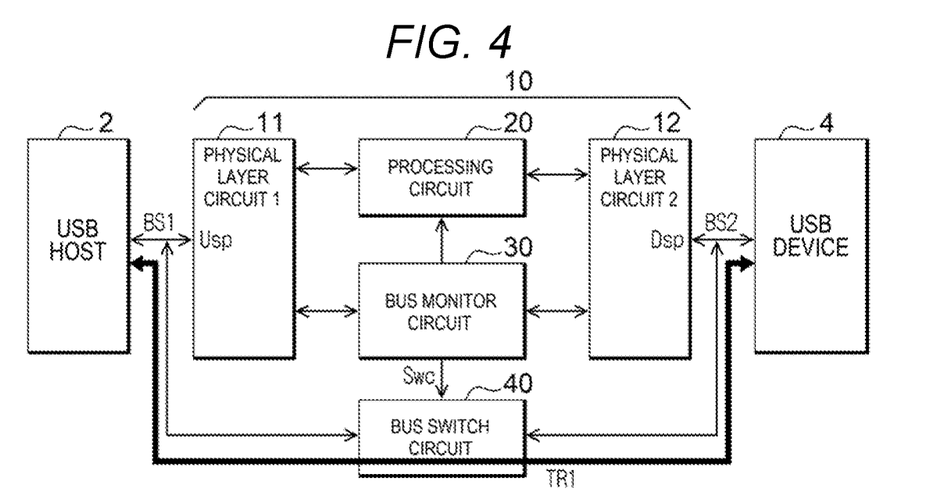
FIG. 4 is a diagram showing a transfer path between the circuit device and other devices.

When it is determined that the HS mode is not possible based on the monitored results of the bus BS1 and the bus BS2, the bus monitor circuit 30 sets the signal Swc to the H level and turns on the bus switch circuit 40. When the bus switch circuit 40 is turned on, as shown in FIG. 4, a packet or the like is transferred between the USB Host 2 and the USB Device 4 via a path TR1 that bypasses the processing circuit 20.

Figure 5:
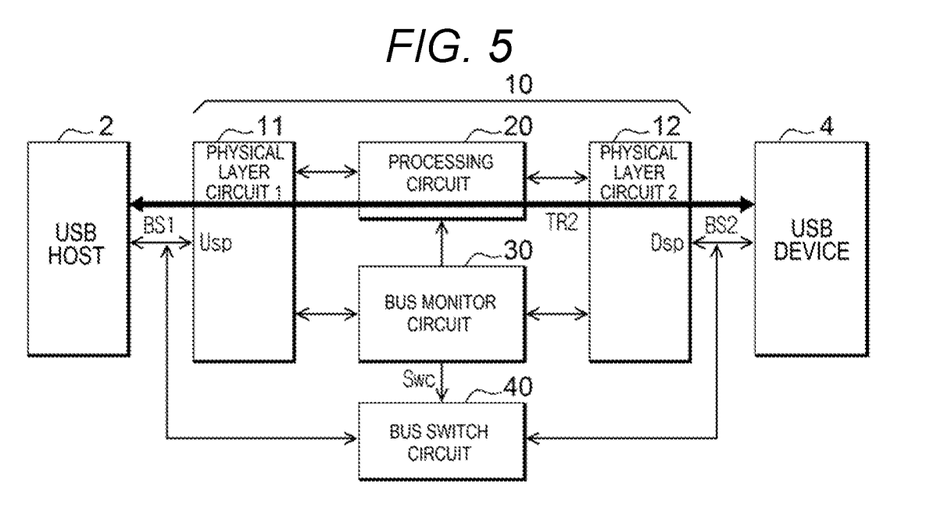
FIG. 5 is a diagram showing a transfer path between the circuit device and other devices.

When it is determined that the HS mode is possible based on the monitored results of the bus BS1 and the bus BS2, the bus monitor circuit 30 sets the signal Swc to the L level and turns off the bus switch circuit 40. When the bus switch circuit 40 is turned off, as shown in FIG. 5, the packet or the like is transferred between the USB Host 2 and the USB Device 4 via a path TR2 passing through the processing circuit 20.

The processing circuit 20 is a circuit that executes various processing such as transfer processing. Specifically, the processing circuit 20 transmits a packet received from the bus BS1 via the physical layer circuit 11 to the bus BS2 via the physical layer circuit 12, and also transmits a packet received from the bus BS2 via the physical layer circuit 12 to the bus BS1 via the physical layer circuit 11. The processing circuit 20 also executes processing such as re-synchronization of packet bits during the transfer processing.

The processing circuit 20 executes the transfer processing or the like without changing a packet format during a part or all of a period when the bus switch circuit 40 is turned off.

The processing circuit 20 and the bus monitor circuit 30 are described as being functionally divided, but the processing circuit 20 and the bus monitor circuit 30 may be configured integrally with a logic circuit such as a gate array or may be configured with a processor such as a CPU or an MPU.

Figure 3:
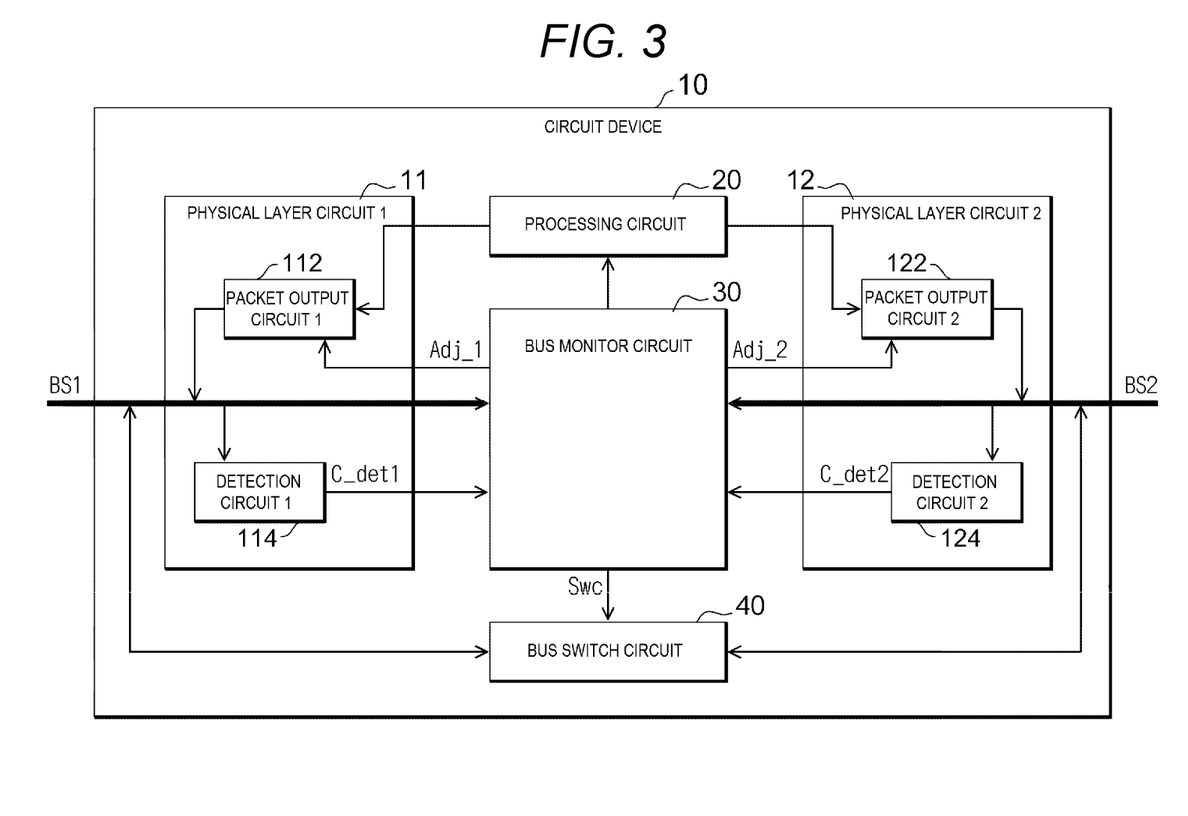
FIG. 3 is a diagram showing the configuration of the circuit device.

FIG. 3 is a diagram showing the configuration of the circuit device 10 in mode detail. In FIG. 3, the physical layer circuit 11 includes a packet output circuit 112 and a detection circuit 114. Similarly to the physical layer circuit 11, the physical layer circuit 12 includes a packet output circuit 122 and a detection circuit 124.

In FIG. 3, '1_ is assigned to elements provided in the physical layer circuit 11 to distinguish the elements from elements provided in the physical layer circuit 12. Similarly, '2_ is assigned to the elements provided in the physical layer circuit 12 to distinguish the elements from the elements provided in the physical layer circuit 11.

In the HS mode, the packet output circuit 112 is used to output a packet supplied to the bus BS2 to the bus BS1 on an opposite side via the processing circuit 20. Specifically, in the HS mode, the packet supplied from the USB Device 4 to the bus BS2 is re-synchronized by the processing circuit 20, and is supplied to the packet output circuit 112. The packet output circuit 112 has an amplifier with a variable amplification factor, amplifies the packet with an amplification factor specified by a signal Adj_1, and outputs the amplified packet to the bus BS1.

Similarly, in the HS mode, the packet output circuit 122 is used to output a packet supplied to the bus BS1 to the bus BS2 on the opposite side via the processing circuit 20. Specifically, in the HS mode, the packet supplied from the USB Host 2 to the bus BS1 is re-synchronized by the processing circuit 20, and is supplied to the packet output circuit 122. The packet output circuit 122 has an amplifier with a variable amplification factor, amplifies the packet with an amplification factor specified by a signal Adj_2, and outputs the amplified packet to the bus BS2.

Signal data transferred according to the USB standard is configured with 'frame_ as a unit, and this 'frame_ is further configured with a plurality of 'transactions_ following a packet called start of frame (SOF). A 'transaction_ is a unit in which significant data transmission and reception are completed, and is configured with a plurality of packets. A packet is a minimum unit of data transferred according to the USB standard, and is divided into several types including SOF.

The packet includes a packet identifier (PID) indicating a type of the packet.

Whether a certain packet is SOF is specified by the PID included in the packet. In addition, an end of packet (EOP) indicates an end of the packet.

In USB, a similar physical layer circuit is also provided in a USB Host and a device. In a physical layer circuit of the device, a termination resistance is provided, and when the USB Device 4 is disconnected, for example, the termination resistance of the USB Device 4 is removed, so that signal amplitudes of the signals DP and DM increase from a viewpoint of the circuit device 10. This point will be described with reference to FIGS. 14A and 14B.

Figure 14A:
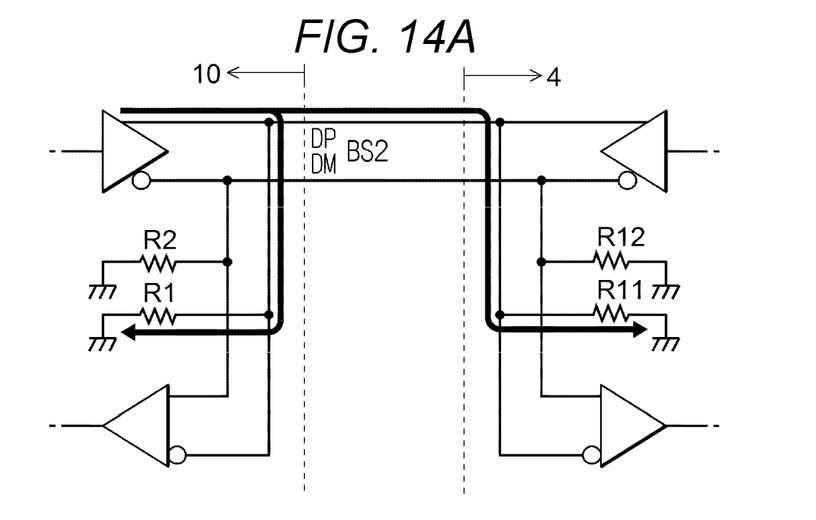
FIGS. 14A and 14B are diagrams showing disconnecting of the USB Device.
Figure 14B:
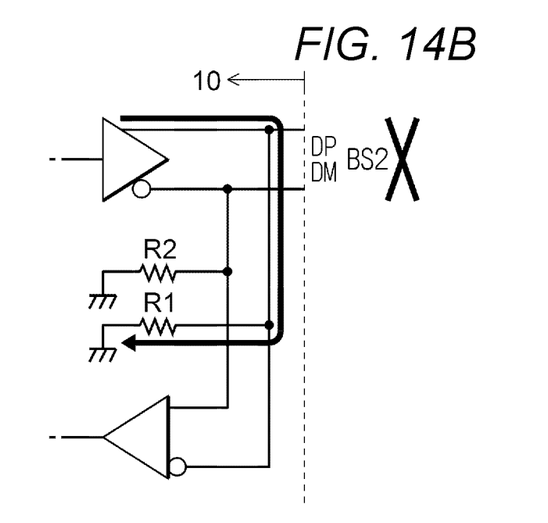

FIGS. 14A and 14B are diagrams showing a main part of the physical layer circuit 12 in the circuit device 10 and a main part of the physical layer circuit in the USB Device 4.

As shown in the drawing, the circuit device 10 includes a transmitter that transmits signals to the bus BS2 by differential transmission, a receiver that receives differential transmission signals from the bus BS2, a pull-down resistor R1 coupled to the signal line of the signal DP among the differential transmission signals, and a pull-down resistor R2 coupled to the signal line of the signal DM among the differential transmission signals. The physical layer circuit of the USB Device 4 has the same configuration, and includes a transmitter, a receiver, and pull-down resistors R11 and R12.

When the USB Device 4 is connected to the bus BS2 as shown in FIG. 14A, the transmitter of the circuit device 10 causes a constant current to flow as the signal DP through a path indicated by a thick line in FIG. 14A. In this case, since two pull-down resistors R1 and R11 are in parallel in the signal line of the signal DP, a combined value of the pull-down resistors is half of a single resistance value of the pull-down resistor R1 or R11. The same applies to the signal line of the signal DM and when the USB Device 4 is connected to the bus BS2, the combined value of the pull-down resistors is half of a single resistance value of the pull-down resistor R2 or R12.

When the USB Device 4 is disconnected from the bus BS2 as shown in FIG. 14B, the transmitter of the circuit device 10 causes a constant current having the same value as that in FIG. 14A to flow as the signal DP through a path indicated by a thick line in FIG. 14B. In this case, since only the pull-down resistor R1 is coupled to the signal line of the signal DP, a pull-down resistance value is doubled compared with when the USB Device 4 is connected.

Therefore, when the USB Device 4 is disconnected from the bus BS2, the resistance value is doubled, and since current values are the same, an amplitude level of the differential signal is doubled compared with an amplitude level of the differential signal in a state where the USB Device 4 is connected.

Therefore, a disconnecting detection level may be set as a threshold value between the amplitude level of the differential signal in a state where the USB Device 4 is connected, and the amplitude level of the differential signal in a state where the USB Device 4 is disconnected, and when an amplitude level of EOP of SOF exceeds the disconnecting detection level, there is a possibility that the USB Device 4 may be disconnected.

In the present embodiment, as will be described later, device disconnecting is not determined immediately after the amplitude level of EOP exceeds the disconnecting detection level as the threshold value.

The reason of using EOP of SOF for comparison is that EOP is convenient for comparison with the disconnecting detection level since amplitude levels of the signals DP and DM configuring the differential signal are fixed for a predetermined time.

Returning to FIG. 3 again, the detection circuit 114 detects whether the amplitude level of EOP of SOF output to the bus BS1 exceeds the disconnecting detection level, and outputs a signal C_det1 as a detection result to notify the bus monitor circuit 30.

Similarly, the detection circuit 124 detects whether the amplitude level of EOP of SOF output to the bus BS2 exceeds the disconnecting detection level, and outputs a signal C_det2 as a detection result to notify the bus monitor circuit 30.

The disconnecting detection level used for determining the disconnecting detection is, for example, 575 mV.

When receiving, by the signal C_det1, the detection result indicating that the amplitude level of EOP of SOF output to the bus BS1 exceeds the disconnecting detection level, the bus monitor circuit 30 changes the amplification factor specified by the signal Adj_1, and then receives the signal C_det1 again, and determines whether the device disconnecting truly occurs.

Similarly, when receiving, by the signal C_det2, the detection result indicating that the amplitude level of EOP of SOF output to the bus BS2 exceeds the disconnecting detection level, the bus monitor circuit 30 changes the amplification factor specified by the signal Adj_2, and then receives the signal C_det2 again, and determines whether the device disconnecting truly occurs.

When it is determined that the device disconnecting truly occurs, the bus monitor circuit 30 sets the signal Swc to the H level and turns on the bus switch circuit 40, and switches the operation nude from the HS mode to the FS nude. By turning on the bus switch circuit 40, a path of the signal of the packet transferred between the USB Host 2 and the USB Device 4 is switched from the path TR2 via the processing circuit 20 to the path TR1 via the bus switch circuit 40.

Figure 10:
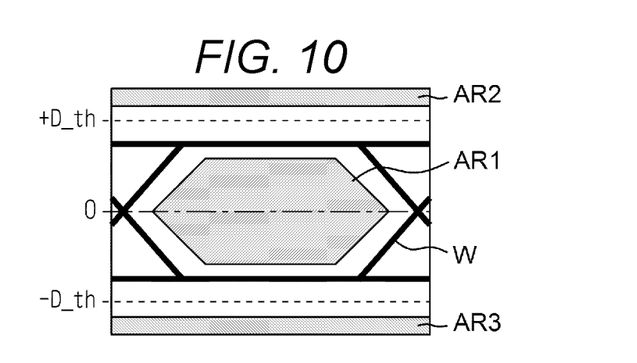
FIG. 10 is a diagram showing an eye pattern.

According to the USB standard, when a signal is transmitted from one end of the USB cable, a pattern with a small opening called Far-End as shown in FIG. 10 is all owed in an eye pattern measured at the other end of the USB cable in consideration of attenuation in the USB cable. Here, the eye pattern refers to a waveform W in which waveforms shown by the signals DP and DM constituting the differential signal are superimposed on a plurality of bits. According to the USB standard, the waveform W does not superimpose in prohibited areas AR1, AR2, and AR3.

Figure 11:
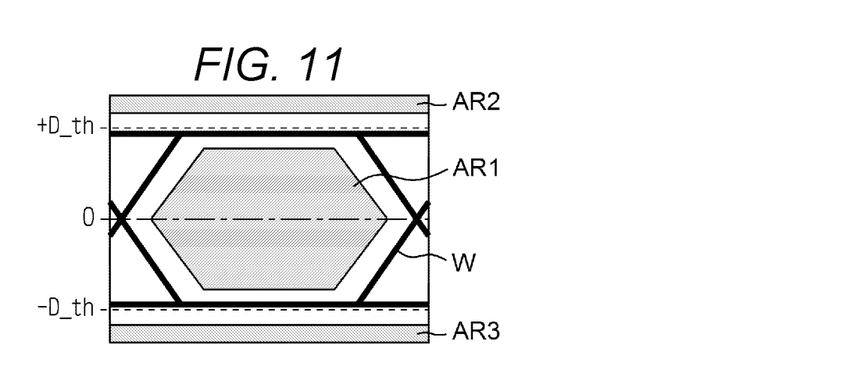
FIG. 11 is a diagram showing an eye pattern.

In recent years, a pattern with a large opening called Near-End with high transmission quality as shown in FIG. 11 may be required at the other end of the USB cable. In order to satisfy this Near-End pattern, amplitude of the signal to be transmitted on one end side of the USB cable is set to be large in consideration of attenuation in the USB cable.

However, since when the amplitude is too large, the amplitude will exceed the disconnecting detection level, in order to satisfy a Near-End requirement, the amplitude of the signal transmitted from one end of the USB cable is set to such a magnitude that does not exceed the disconnecting detection level.

However, when the amplitude of the transmitted signal is set to the magnitude that does not exceed the disconnecting detection level, for some reason, such as when noise is super imposed on the USB cable, the amplitude of the signal transmitted to the USB cable may exceed the disconnecting detection level.

At this time, although the device is connected to the other end of the USB cable, it is erroneously determined that the device is disconnected.

In order to prevent such an erroneous determination, as described in the background art, there is a technique for increasing the disconnecting detection level when the amplitude level of the signal is increased. However, since the technique requires a separate configuration for changing the disconnecting detection level, the configuration is likely to be complicated.

Therefore, in the present embodiment, the bus monitor circuit 30 determines whether the device disconnecting occurs as follows.

Figure 6:
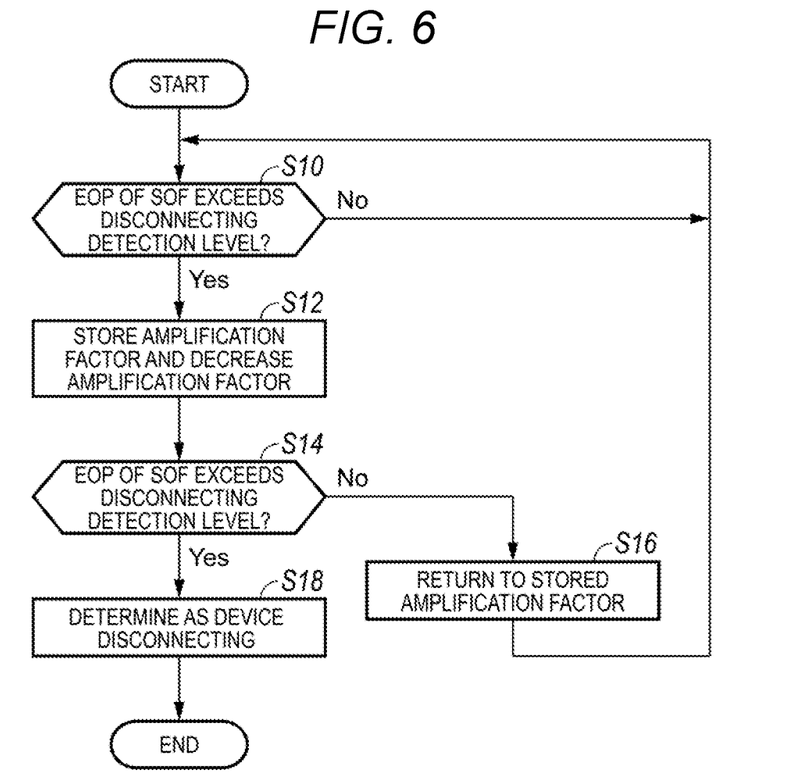
FIG. 6 is a flowchart showing an operation of the circuit device.

FIG. 6 is a flowchart showing an operation of device disconnecting determination in the circuit device 10 according to the present embodiment. In the present embodiment, the disconnecting of the device connected to the bus BS1 and the bus BS2 can be determined, but the determination on disconnecting of the USB Device 4 connected to the bus BS2 is a problem in the connecting shown in FIG. 1. Therefore, in the present embodiment, the determination on whether the USB Device 4 is disconnected will be described.

In the FS node, the bus switch circuit 40 is turned on, so that the packet or the like is transferred between the USB Host 2 and the USB Device 4 via the path TR1 that bypasses the processing circuit 20. Therefore, the operation of device disconnecting determination is executed when the packet or the like is transferred via the path TR2 that passes through the processing circuit 20, that is, in the HS node.

First, in the HS node, the bus monitor circuit 30 determines, based on the signal C_det2, whether the amplitude level of EOP of SOF output to the bus BS2 exceeds the disconnecting detection level (step S10).

If the amplitude level of EOP does not exceed the disconnecting detection level (if a determination result in step S10 is 'No_), a processing procedure returns to step S10 and circulates. In other words, the bus monitor circuit 30 does not perform following processing until the amplitude level of EOP exceeds the disconnecting detection level.

On the other hand, if the amplitude level of EOP exceeds the disconnecting detection level (if the determination result in step S10 is 'Yes_), the bus monitor circuit 30 instructs the packet output circuit 122 to change the amplification factor of the packet re-synchronized by the processing circuit 20 (step S12). Specifically, the bus monitor circuit 30 temporarily stores an amplification factor so far, and specifies, for example, a lowest amplification factor among the amplification factors that can be amplified by the packet output circuit 122 by the signal Adj_2.

Since the amplification factor of the packet re-synchronized by the processing circuit 20 is changed to the lowest amplification factor, the amplitude level of the packet output to the bus BS2 is lowered.

Thereafter, the bus monitor circuit 30 determines again, based on the signal C_det2, whether the amplitude level of EOP of SOF output to the bus BS2 exceeds the disconnecting detection level (step S14).

If the amplitude level of EOP does not exceed the disconnecting detection level (if a determination result of step S14 is 'No_), the bus monitor circuit 30 determines as follows. Specifically, the bus monitor circuit 30 determines that the fact that the amplitude level of EOP exceeds the disconnecting detection level in step S10 is a temporary phenomenon due to noise or the like, and the device disconnecting does not actually occur. Therefore, the bus monitor circuit 30 returns the amplification factor specified by the signal Adj_2 to the temporarily stored amplification factor (step S16). Thereafter, the processing procedure returns to step S10.

On the other hand, if the amplitude level of EOP exceeds the disconnecting detection level (if the determination result of step S14 is 'Yes_), the bus monitor circuit 30 determines as follow. Specifically, the bus monitor circuit 30 determines that the fact that the amplitude level of EOP exceeds the disconnecting detection level in step S10 is not a temporary phenomenon due to noise or the like, and the device disconnecting truly occurs (step S18).

If it is determined that the device disconnecting occurs, the HS mode cannot be continued thereafter, and therefore, the bus monitor circuit 30 switches the operation mode to the FS mode.

Here, in order to describe superiority of the circuit device 10 according to the embodiment, an operation of a comparative example will be described. In the comparative example, when the amplitude level of the packet to the bus BS2 exceeds the disconnecting detection level, the bus monitor circuit 30 immediately determines that the USB Device 4 is disconnected from the bus BS2, that is, the device disconnecting occurs.

Figure 13:
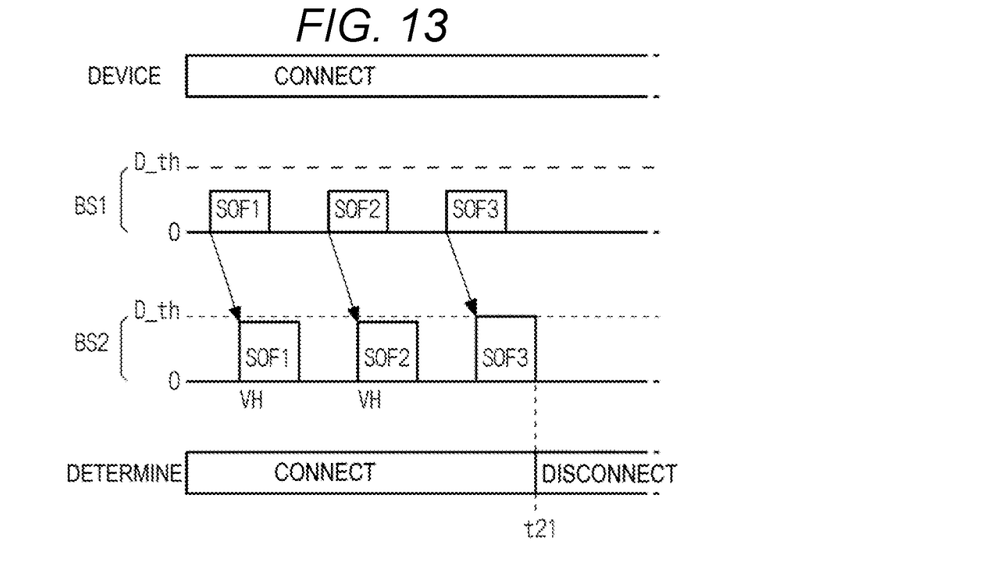
FIG. 13 is a diagram showing an operation according to a comparative example.

In step 12, the amplification factor up to that point is stored, but the amplification factor may be stored in advance before the an operation of device disconnecting determination is started. FIG. 13 is a diagram showing an operation of the comparative example, and shows the operation in a state where the connecting of the USB Device 4 to the bus BS2 is maintained, that is, a state where the USB Device 4 is not disconnected from the bus BS2. In order to simplify the description, it is assumed that only SOF is output as an HS packet transmitted from the host device 2 to the circuit device 10, that is, a packet in the HS mode. In addition, in the drawing, packets SOFs are written as SOF1, SOF2, SOF3 ŭ in order to distinguish the packets SOFs in order of time. An amplitude level of the packet SOF is simply shovel by an absolute value of one of the signal DM or the signal DP in the drawing.

The packets SOF1 and SOF2 transmitted from the USB Host 2 to the bus BS1 are re-synchronized by the processing circuit 20 in the circuit device 10, amplified by the packet output circuit 122, and transmitted to the bus BS2. Here, an amplitude level of EOP in the packet SOF1 or SOF2 transmitted to the bus BS2 is VH which is less than a disconnecting detection level D_th. The amplitude level VH is the amplitude level before being changed by an instruction in step S12.

When an amplitude level of the packet SOF3 transmitted to the bus BS2 exceeds the disconnecting detection level D_th due to superposition of noise or the like on the bus BS2, the bus monitor circuit 30 determines that device disconnecting occurs even though the USB Device 4 is actually connected to the bus BS2.

Therefore, at a time point t21, the bus monitor circuit 30 switches the operation mode from the HS mode to the FS mode. Accordingly, since the bus switch circuit 40 is turned on, the packets are supplied via the path TR1 after the time point t21.

In the comparative example, after the time point t21, the USB Host 2 detects the amplitude level of the packet, determines that the USB Device 4 is disconnected, and ends communication in the HS mode.

Figure 7:
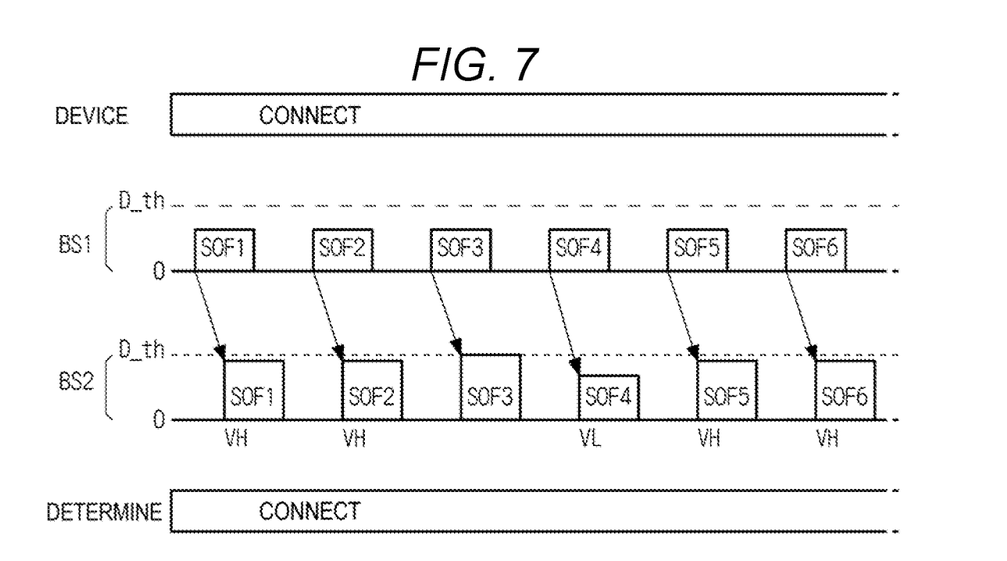
FIG. 7 is a diagram showing the operation of the circuit device.

FIG. 7 is a diagram showing the operation of the circuit device 10 according to the embodiment, and shows the operation in a state where the USB Device 4 is connected to the bus BS2.

As shown in the drawing, the operation until the packet SOF3 is transmitted to the bus BS2 is the same as that of the comparative example.

In the present embodiment, even though the amplitude level of the packet SOF3 transmitted to the bus BS2 exceeds the disconnecting detection level D_th due to superimposition of noise or the like on the bus BS2, it is not immediately determined that device disconnecting occurs. That is, when the amplitude level of the packet SOF3 exceeds the disconnecting detection level D_th, the amplification factor in the packet output circuit 122 is temporarily lowered by the instruction from the bus monitor circuit 30. Therefore, when the USB Device 4 is connected to the bus BS2, an amplitude level of a packet SOF4 transmitted from the packet output circuit 122 to the bus BS2 is lowered to VL, and does not exceed the disconnecting detection level D_th. Therefore, it is not yet determined at this time point that the USB Device 4 is disconnected from the bus BS2.

Thereafter, since the bus monitor circuit 30 instructs the packet output circuit 122 to return the amplification factor to an original level, an amplitude level of a packet SOF5 transmitted to the bus BS2 becomes an original VH.

When the USB Device 4 is connected to the bus BS2, among the packets transmitted to the bus BS2, those after the packet SOF3 having an amplitude level exceeding the disconnecting detection level D_th and the packet SOF4 having the lowered amplitude level are received by the USB Device 4 while the US mode is maintained. Therefore, communication efficiency is not lowered.

Figure 8:
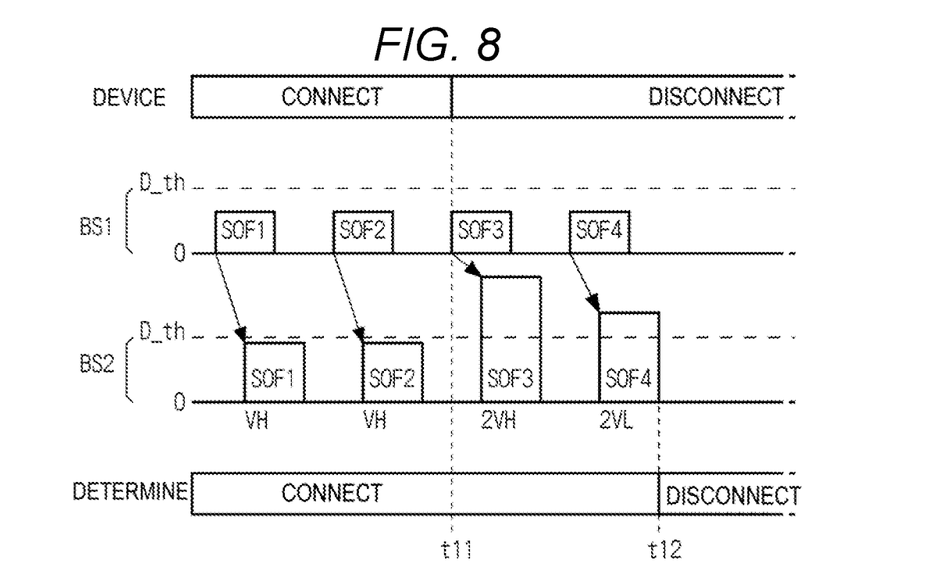
FIG. 8 is a diagram showing an operation of the circuit device.

FIG. 8 is a diagram showing an operation of the circuit device 10 according to the embodiment, and shows the operation when the USB Device 4 is disconnected from the bus BS2 at a time point t11, for example.

When the USB Device 4 is disconnected from the bus BS2 at the time point t11, the amplitude level of the packet SOF3 transmitted to the bus BS2 after the time point t11 becomes 2VH which is twice the amplitude level VH of the packet SOF1 or SOF2 transmitted before the time point t11, and exceeds the disconnecting detection level D_th.

In the present embodiment, it is not yet determined at this time point that the USB Device 4 is disconnected from the bus BS2.

Thereafter, the amplification factor in the packet output circuit 122 is lowered by the instruction from the bus monitor circuit 30. However, since the USB Device 4 is disconnected from the bus BS2, the amplitude level of the packet SOF4 transmitted from the packet output circuit 122 to the bus BS2 rises to 2VL, and exceeds the disconnecting detection level D_th again. When the disconnecting detection level D_th is exceeded again at this time point, the bus monitor circuit 30 determines that the device disconnecting occurs, and switches the operation mode from the HS mode to the FS mode at a time point t12. Accordingly, since the bus switch circuit 40 is turned on, the packets are supplied via the path TR1 after the time point t12.

In the embodiment, after the time point t12, the USB Host 2 detects the amplitude level of the packet, determines that the USB Device 4 is disconnected, and ends the communication in the HS mode.

As described above, in the present embodiment, even though the amplitude level of the packet exceeds the disconnecting detection level D_th due to noise or the like, it is not immediately determined that the device disconnecting occurs. After the amplitude level of the packet exceeds the disconnecting detection level C_th and the instruction to lower the amplification factor is given, at a time point when the disconnecting detection level D_th is exceeded again, it is determined that the device connecting occurs. Therefore, according to the present embodiment, since it is not necessary to change the disconnecting detection level D_th, it is possible to avoid complication of the configuration.

In addition, in the present embodiment, it is possible to prevent the HS mode between the USB Host 2 and the USB Device 4 from being interrupted by erroneously determining that the device disconnecting occurs due to influence of noise or the like.

Figure 9:
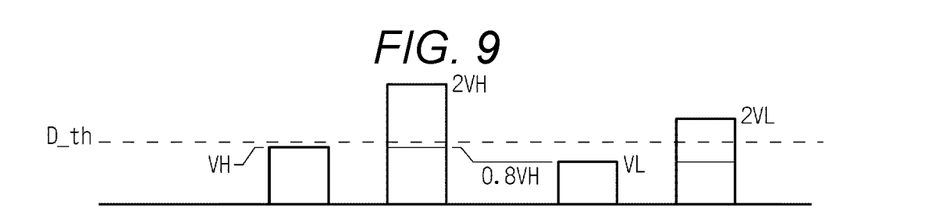
FIG. 9 is a diagram showing comparison of amplitude levels.

Next, a relationship between the amplitude levels VL and VH and the disconnecting detection level D_th will be described with reference to FIG. 9.

When the USB Device 4 is connected, the amplitude level VL that is lowered in step S12 needs to be less than the disconnecting detection level D_th, and when the USB Device 4 is disconnected, the amplitude level which is twice the amplitude level VL needs to exceed the disconnecting detection level D_th. Therefore, it is necessary to satisfy the following relationship.

$$VL < D\_th < 2VL \qquad (1)$$

In the present embodiment, by making the amplitude level VL and the disconnecting detection level D_th satisfy the above relationship, the erroneous determination of the device disconnecting can be prevented and the true determination of the device disconnecting can be reliably implemented.

In Formula (1), in particular, if the relationship of D_th<2VL is not satisfied, the determination result in step S14 becomes 'No_ even though the device disconnecting occurs, and the processing procedure circulates along a path of steps S14, S16, S10, S12, S14. In other words, by making the amplitude level VL and the disconnecting detection level D_th satisfy the relationship in Formula (1), the erroneous determination of the device disconnecting can be prevented and the true determination of the device disconnecting can be reliably implemented.

In the embodiment, in step S12, the bus monitor circuit 30 specifies the lowest amplification factor among the amplification factors that can be amplified by the packet output circuit 122, but it is sufficient as long as the relationship in the following formula is satisfied: VL<VH.

Therefore, the bus monitor circuit 30 may instruct to set a low amplification factor, for example, in the packet output circuit 122 in step S12.

However, when the amplitude level in step S12 is VL, if a lowering amount from the amplitude level VH is small, in step S14, even though the USB Device 4 is not disconnected, the amplitude level VL may again exceed the disconnecting detection level D_th due to the influence of noise or the like.

When the maximum value of the amplitude level is 500 mV and the minimum value is 400 mV, if the amplitude level VL lowered in step S12 is set to 0.8 times or less of the maximum value of the amplitude level VH before being lowered, and for example, even if the maximum value of the amplitude level VH is 500 mV, a possibility of erroneous determination can be lowered.

Even when the amplitude level VL is set to 0.8 times or less of the amplitude level VH, as described above, in step S14, if the USB Device 4 is disconnected, the amplitude level is doubled to 2VL, so that it is necessary to satisfy the relationship D_th<2VL in Formula (1).

In the embodiment, the amplitude level of the packet is uniformly changed by lowering the amplification factor by the signal Adj_2 in step S12. Since EOP of SOF is used for comparison with the disconnecting detection level D_th, only the amplitude level of EOP of SOF may be changed. That is, in step S12, when it is detected that the amplitude level exceeds the disconnecting detection level, the amplitude level of all packets may be lowered, or only the amplitude level of EOP of SOF may be lowered.

In the embodiment, a connecting state is assumed as shown in FIG. 1, and since the circuit device 10 has a symmetry with respect to cent ers of the processing circuit 20, the bus monitor circuit 30, and the bus switch circuit 40, the USB Host 2 may be connected to the bus BS2, the USB Device 4 may be connected to the bus BS1, and it may be determined whether the USB Device 4 connected to the bus BS1 is disconnected.

Further, a packet output function by the packet output circuit 122, an amplitude level detection function by the detection circuit 114, and a determination function by the bus monitor circuit 30 in the embodiment may be applied to a port other than a repeater, for example, a next port. That is, the above functions in the embodiment may be applied to a downstream port of the USB Host 2 or a downstream port of a hub that distributes a packet received from an upstream device to one or more downstream devices.

Figure 12:
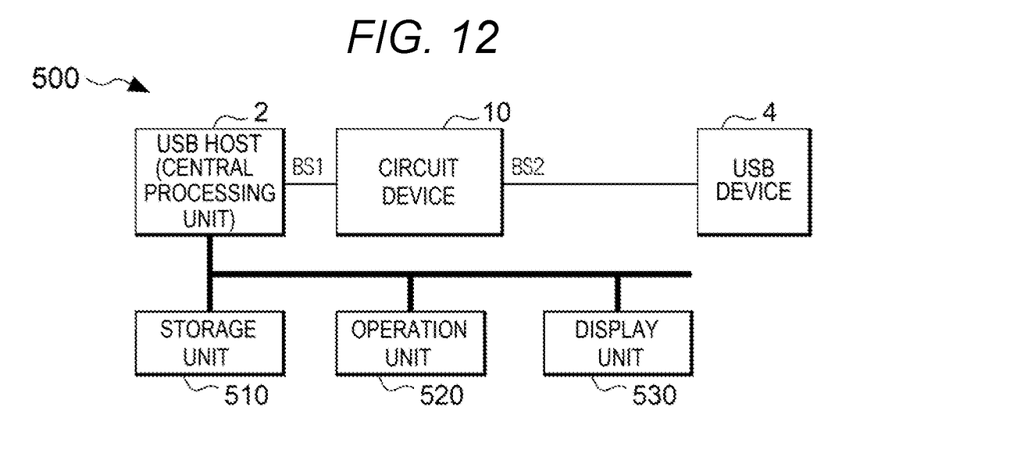
FIG. 12 is a diagram showing an example of an electronic apparatus to which the circuit device according to the embodiment is applied.

FIG. 12 is a diagram showing an example of an electronic apparatus 500 including the circuit device 10 according to the embodiment. The electronic apparatus 500 includes the circuit device 10 and the USB Host 2. The USB Host 2 here is an example of a central processing unit. The USB Host 2 is connected to the circuit device 10 via the bus BS1. The circuit device 10 is connected to, for example, the USB Device 4 via the bus BS2.

The USB Host 2 may be implemented by a processor such as the CPU or the MPU, or may be implemented by a circuit board on which one or more semiconductor integrated circuits, electronic components, and the like are mounted.

The electronic apparatus 500 may further include a storage unit 510, an operation unit 520, and a display unit 530. The storage unit 510 stores data, and a function of the storage unit 510 is implemented by a semiconductor memory, a hard disk drive (HDD), or the like. The operation unit 520 is for a user to perform an input operation, and is implemented by an operation device such as an operation button or a touch panel display. The display unit 530 displays various types of information, and is implemented by a display such as a liquid crystal or an organic EL. When the touch panel display is used as the operation unit 520, the touch panel display also functions as the operation unit 520 and the display unit 530.

Examples of the electronic apparatus 500 is assumed to be various devices such as an in-vehicle equipment, a printing device, a projection device, a robot, a head-mounted display device, a biofogical information measuring equipment, a measuring equipment that measures physical quantities such as distance, time, flow rate or flow rate, a network-related equipment such as a base station or a router, a content provider that delivers content, or a video equipment such as a digital camera or a video camera.

What is claimed is:

1. A circuit device comprising:
   a packet output circuit configured to transmit a packet to a bus according to a USB standard in a manner capable of changing an amplitude level of the packet;
   a detection circuit configured to detect whether an amplitude level of a packet transmitted to the bus exceeds a discoupling detection level; and
   a control circuit configured to instruct, when the detection circuit detects that the amplitude level of the packet exceeds the discoupling detection level, the packet output circuit to lower an amplitude level of a part or all of packets, and after the instruction, to determine that, when the detection circuit detects that an amplitude level of a packet again exceeds the disconnecting detection level, a USB device connected to the bus is disconnected.

2. The circuit device according to claim 1, wherein
   $D\_th < 2VL$,

D_th being the disconnecting detection level, and
   VL being the amplitude level of the packet output from the packet output circuit according to the instruction.

3. The circuit device according to claim 2, wherein
   $DL < 0.8VH$,

VH being the amplitude level of the packet output from the packet output circuit before the instruction.

4. The circuit device according to claim 1, wherein
   the control circuit determines that the USB device is not disconnected from the bus when the detection circuit detects that, after the instruction, the amplitude level of the packet does not exceed the disconnecting detection level.

5. The circuit device according to claim 1, wherein
   the packet output circuit transmits a packet supplied to a bus different from the bus to the bus.

6. An electronic apparatus comprising:
   the circuit device according to claim 1; and
   a central processing unit connected to the bus.

* * * * *